（12） United States Patent
Takabayashi et al.

(10) Patent No.: US 9,698,570 B2
(45) Date of Patent: Jul. 4, 2017

(54) OPTICAL SEMICONDUCTOR ELEMENT AND METHOD OF MANUFACTURING THE SAME

(71) Applicant: FUJITSU LIMITED, Kawasaki-shi, Kanagawa (JP)

(72) Inventors: Kazumasa Takabayashi, Atsugi (JP); Tsuyoshi Yamamoto, Zama (JP); Tokuharu Kimura, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/205,471

(22) Filed: Jul. 8, 2016

(65) Prior Publication Data

US 2016/0322787 A1 Nov. 3, 2016

Related U.S. Application Data

(63) Continuation of application No. PCT/JP2014/050323, filed on Jan. 10, 2014.

(51) Int. Cl.
| | |
|---|---|
| *H01S 5/00* | (2006.01) |
| *H01S 5/34* | (2006.01) |
| *H01S 5/22* | (2006.01) |
| *H01S 5/20* | (2006.01) |
| *H01S 5/026* | (2006.01) |
| *H01S 5/10* | (2006.01) |
| *H01S 5/30* | (2006.01) |

(52) U.S. Cl.
CPC .............. *H01S 5/341* (2013.01); *H01S 5/026* (2013.01); *H01S 5/1014* (2013.01); *H01S 5/20* (2013.01);

(Continued)

(58) Field of Classification Search
CPC .......... H01S 5/341; H01S 5/3013; H01S 5/22; H01S 5/1014; H01S 5/026; H01S 5/3412;
(Continued)

(56) References Cited

U.S. PATENT DOCUMENTS

| 5,987,046 A | 11/1999 | Kobayashi |
| 6,181,722 B1 | 1/2001 | Duetting |

(Continued)

FOREIGN PATENT DOCUMENTS

| JP | H07-66502 | 3/1995 |
| JP | H10-242572 | 9/1998 |

(Continued)

OTHER PUBLICATIONS

International Search Report for International Application No. PCT/JP2014/50323 dated Apr. 22, 2014.

*Primary Examiner* — Kinam Park
(74) *Attorney, Agent, or Firm* — Kratz, Quintos & Hanson, LLP

(57) ABSTRACT

A quantum dot laser includes a GaAs substrate, a quantum dot active layer which has a barrier layer of GaAs and quantum dots, a GaAs waveguide core layer which is joined to the quantum dot active layer, and a lower cladding layer and an upper cladding layer which sandwich the quantum dot active layer and the GaAs waveguide core layer. The GaAs waveguide core layer extends from a front end of the quantum dot active layer and has a thickness which gradually decreases in a direction to depart from the front end of the quantum dot active layer, a refractive index of a first cladding layer is higher than a refractive index of a second cladding layer. With this structure, expansion of the optical mode diameter that is more than necessary is inhibited to prevent leakage of light, thereby obtaining sufficient optical output.

13 Claims, 11 Drawing Sheets

(52) U.S. Cl.
CPC ............... *H01S 5/204* (2013.01); *H01S 5/22* (2013.01); *H01S 5/222* (2013.01); *H01S 5/3013* (2013.01); *H01S 5/3412* (2013.01); *H01S 5/1032* (2013.01)

(58) Field of Classification Search
CPC .......... H01S 5/1032; H01S 5/20; H01S 5/204; H01S 5/222
See application file for complete search history.

(56) References Cited

U.S. PATENT DOCUMENTS

| | | |
|---|---|---|
| 2005/0220158 A1 | 10/2005 | Koyama |
| 2006/0056472 A1* | 3/2006 | Ogura ................... B82Y 10/00 372/43.01 |
| 2007/0248134 A1* | 10/2007 | Hatori |
| 2008/0089367 A1* | 4/2008 | Srinivasan ............ B82Y 20/00 372/19 |
| 2008/0144691 A1 | 6/2008 | Hatori |
| 2009/0086785 A1* | 4/2009 | Hatori ................... B82Y 20/00 372/50.11 |
| 2011/0027926 A1 | 2/2011 | Hatori |

FOREIGN PATENT DOCUMENTS

| | | |
|---|---|---|
| JP | 2002-217446 A1 | 8/2002 |
| JP | 2005-286198 A1 | 10/2005 |
| JP | 2007-243019 A1 | 9/2007 |
| JP | 2008-153260 A1 | 7/2008 |
| JP | 2011-197453 A1 | 10/2011 |
| WO | WO 98/00894 A2 | 1/1998 |
| WO | WO 2007/040600 A2 | 4/2007 |

* cited by examiner

COMPARATIVE EXAMPLE 1

FIRST EMBODIMENT

OPTICAL SEMICONDUCTOR ELEMENT AND METHOD OF MANUFACTURING THE SAME

CROSS-REFERENCE TO RELATED APPLICATION

This application is a continuation application of International Application PCT/JP2014/050323 filed on Jan. 10, 2014 and designated the U.S., the entire contents of which are incorporated herein by reference.

FIELD

The embodiments discussed herein are directed to an optical semiconductor element and a method of manufacturing the same.

BACKGROUND

A semiconductor laser, which is an optical semiconductor element, is widely used as a light source for optical communication. In view of reduction of costs and reduction of power consumption, a semiconductor laser is demanded that is usable without performing temperature adjustment by means of a Peltier element, or the like. A quantum dot laser employing quantum dots as an active layer is known to have a small deterioration in properties in operation at high temperatures, due to the effect of discretization of energy levels, or the like due to the effect of three-dimensional quantum confinement, and is suitable for operation without temperature adjustment.

Patent Document 1: Japanese Laid-open Patent Publication No. 2011-197453
Patent Document 2: Japanese Laid-open Patent Publication No. 2005-286198
Patent Document 3: Japanese Laid-open Patent Publication No. 10-242572
Patent Document 4: Japanese Laid-open Patent Publication No. 2002-217446

SUMMARY

In the quantum dot laser, the ratio of volume occupied by the quantum dots which are gain media is small in the active layer, and hence it is necessary to form multiple layers of quantum dots to increase the light confinement effect in the active layer, in order to obtain sufficient gain. However, when the active layer is made thick to enhance the light confinement effect, an optical mode distribution in a laser waveguide becomes narrow, and the radiation angle of laser emission light widens. Thus, there is a problem that when it is attempted to couple an optical fiber or any other optical device and the quantum dot laser, there is a large coupling loss and sufficient optical output cannot be extracted.

According to an aspect of the embodiments, an optical semiconductor element includes a GaAs semiconductor substrate, a quantum dot active layer which has a barrier layer of GaAs and quantum dots, a GaAs waveguide core layer which is joined to the quantum dot active layer and has a thickness which gradually decreases in a direction to depart from the quantum dot active layer, and a lower cladding layer and an upper cladding layer which sandwich the quantum dot active layer and the GaAs waveguide core layer, wherein each of the lower cladding layer and the upper cladding layer is a layered structure which has a first cladding layer and a second cladding layer which is disposed on a side farther from the quantum dot active layer and the GaAs waveguide core layer than the first cladding layer, and a refractive index of the first cladding layer is higher than a refractive index of the second cladding layer.

According to an aspect of the embodiments, a method of manufacturing an optical semiconductor element, the method includes sequentially forming on a GaAs substrate a lower cladding layer, a lower guide layer, a quantum dot active layer which has a barrier layer of GaAs and quantum dots, and an upper guide layer, forming a mask which covers a portion where a waveguide constituted of the quantum dot active layer is formed, etching a portion other than the portion covered with the mask so that a portion of the lower guide layer or a portion of the quantum dot active layer remains, and selectively forming a GaAs waveguide core layer on a portion removed by the etching, and joining the quantum dot active layer and the GaAs waveguide core layer.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, various embodiments of an optical semiconductor element and a method of manufacturing the same will be explained in detail with reference to drawings. In the various embodiments below, what is called a quantum dot laser is illustrated as the optical semiconductor element.

First Embodiment

To begin with, a first embodiment will be explained.

Structure of the Quantum Dot Laser

Figure 1:
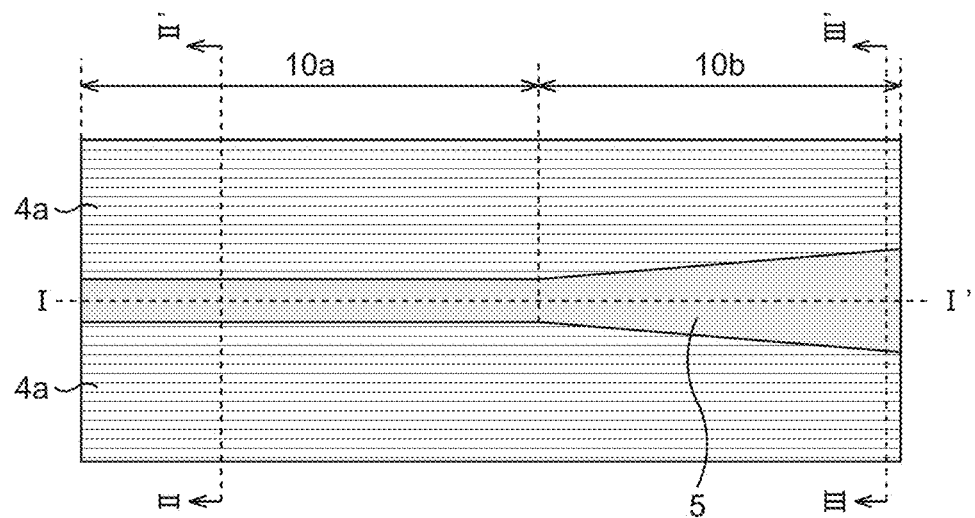
FIG. 1 is a schematic plan view illustrating the structure of a quantum dot laser according to a first embodiment.
Figure 2:
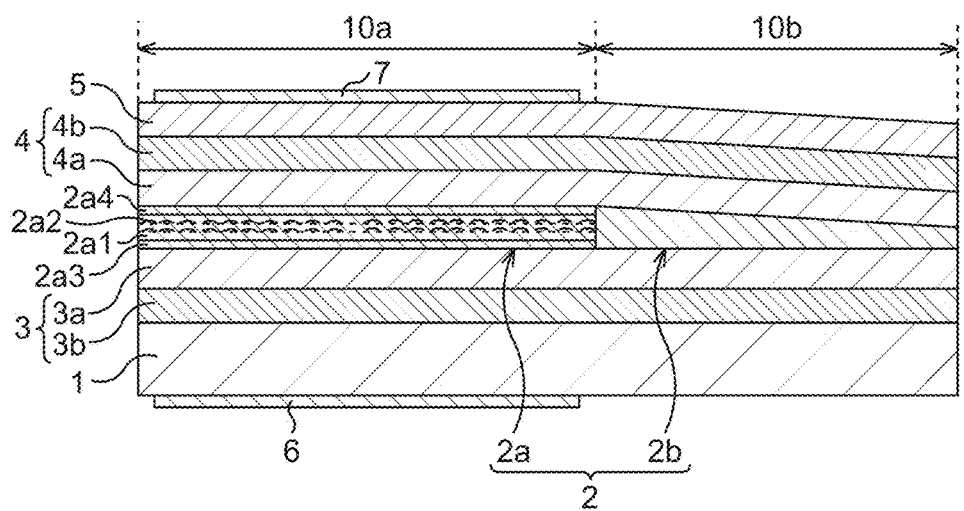
FIG. 2 is a schematic cross-sectional view taken along a dashed line I-I' of FIG. 1.
Figure 3:
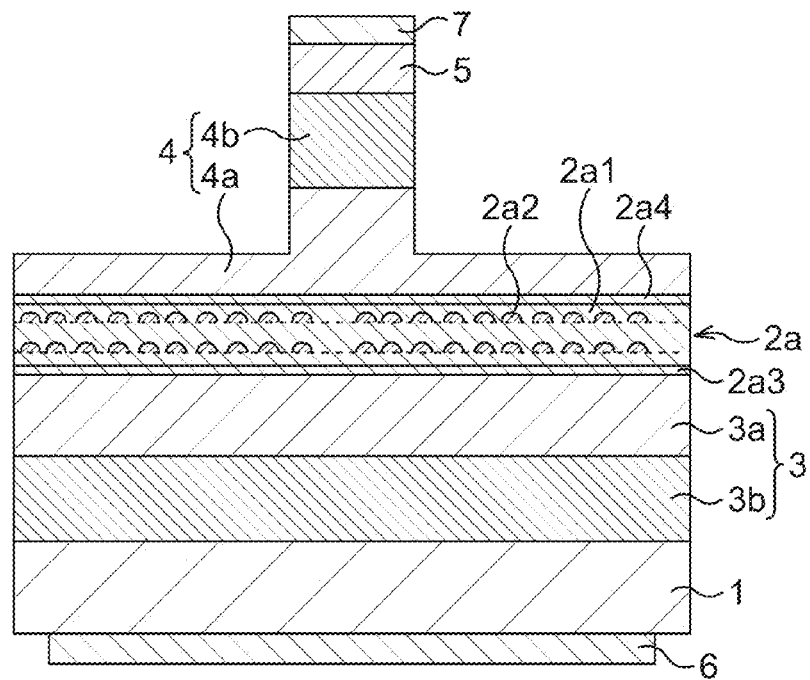
FIG. 3 is a schematic cross-sectional view taken along a dashed line II-II' of FIG. 1.
Figure 4:
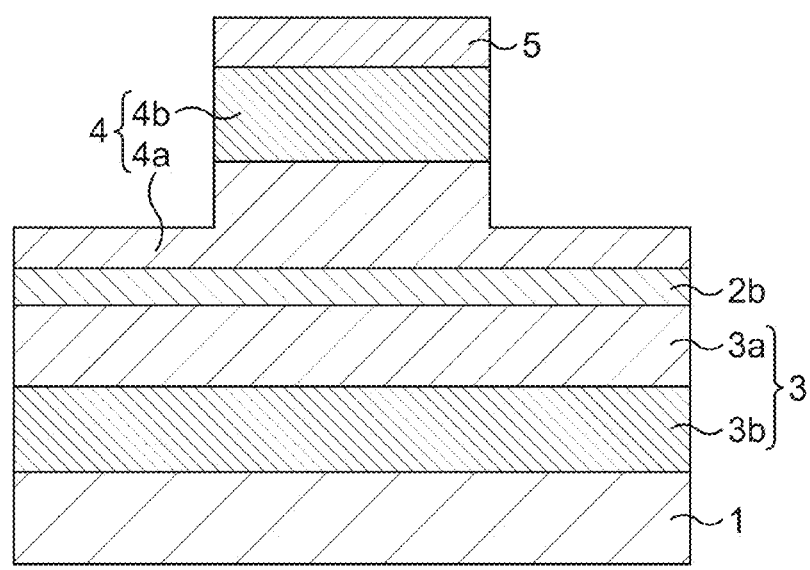
FIG. 4 is a schematic cross-sectional view taken along a dashed line III-III' of FIG. 1.

FIG. 1 is a schematic plan view illustrating the structure of a quantum dot laser according to the first embodiment. FIG. 2 is a schematic cross-sectional view taken along a dashed line I-I' of FIG. 1. FIG. 3 is a schematic cross-sectional view taken along a dashed line II-II' of FIG. 1. FIG. 4 is a schematic cross-sectional view taken along a dashed line III-III' of FIG. 1. Note that for the convenience of illustration, an upper surface electrode is omitted in FIG. 1.

The quantum dot laser according to this embodiment is a quantum dot laser with a spot-size converter. This quantum dot laser has a structure including a p-type GaAs substrate 1 as a semiconductor substrate, a quantum dot active layer 2a having a barrier layer of GaAs, a GaAs waveguide core layer 2b joined to the quantum dot active layer 2a, a lower cladding layer 3 and an upper cladding layer 4 which sandwich the quantum dot active layer 2a and the GaAs waveguide core layer 2b, a contact layer 5, a lower surface electrode 6, and an upper surface electrode 7.

In the quantum dot active layer 2a, a plurality of, for example eight, layers are formed in which, for example, quantum dots 2a2 of InAs are formed on, for example, a barrier layer 2a1 of GaAs with a thickness of about 40 nm, and for example, a guide layer 2a3 and a guide layer 2a4 of GaAs with a thickness of about 40 nm are further formed on a lower surface and an upper surface thereof, respectively, resulting in a constant thickness of about 400 nm. The shapes of the quantum dots 2a2 are adjusted appropriately so that desired gain can be obtained with a desired wavelength, for example, a wavelength of 1300 nm or the like. The ridge structure on the active layer 2a extends with a substantially constant width, here a constant with of about 1.5 µm, in plan view as in FIG. 1.

The GaAs waveguide core layer 2b gradually decreases in thickness in a direction to depart from a front end of the quantum dot active layer 2a, has a thickness of about 400 nm which is the same as the active layer 2a in a portion in contact with the front end of the active layer 2a, and has a thickness of about 200 nm on a light emission end. The ridge structure of the GaAs waveguide core layer 2b in plan view extends to gradually increase in width in the direction to depart from the front end of the quantum dot active layer 2a, as in FIG. 1. Specifically, the ridge structure on the core layer 2b gradually increases in width in the direction to depart from the front end of the active layer 2a so that the width in the light emission end is about 2.5 µm.

The lower cladding layer 3 has a structure in which a lower first cladding layer 3a and a lower second cladding layer 3b are layered.

The lower first cladding layer 3a is formed on a lower surface of an optical waveguide layer 2. The lower second cladding layer 3b is farther from the optical waveguide layer 2 than the lower first cladding layer 3a, and is formed under the lower first cladding layer 3a (over the p-type GaAs substrate 1).

The lower first cladding layer 3a and the lower second cladding layer 3b are both p-type AlGaAs (p-AlGaAs) layers. The lower first cladding layer 3a is formed with a thickness equal to or more than 1 µm, for example about 1.5 µm. The lower second cladding layer 3b is formed with a thickness of, for example, about 0.5 µm.

The refractive index of the lower first cladding layer 3a is higher than the refractive index of the lower second cladding layer 3b. In this embodiment, an Al composition ratio in p-AlGaAs of the lower first cladding layer 3a is adjusted to be lower than the Al composition ratio in the p-AlGaAs of the lower second cladding layer 3b. Specifically, the Al composition ratio of the lower first cladding layer 3a is about 0.1 to about 0.25, for example 0.23 ($Al_{0.23}Ga_{0.77}As$). The Al composition ratio of the lower second cladding layer 3b is higher than the Al composition ratio of the lower first cladding layer 3a by 0.05 or more, and is about 0.15 to about 0.3 or more, for example 0.3 ($Al_{0.3}Ga_{0.7}As$).

The upper cladding layer 4 has a structure in which an upper first cladding layer 4a and an upper second cladding layer 4b are layered.

The upper first cladding layer 4a is formed on an upper surface of the optical waveguide layer 2. The upper second cladding layer 4b is farther from the optical waveguide layer 2 than the upper first cladding layer 4a, and is formed over the upper first cladding layer 4a.

The upper first cladding layer 4a and the upper second cladding layer 4b are both n-type AlGaAs (n-AlGaAs) layer. The upper first cladding layer 4a is formed with a thickness equal to or more than 1 µm, here, the same thickness as that of the lower first cladding layer 3a. The upper second cladding layer 4b is formed here with the same thickness as that of the lower second cladding layer 3b.

The refractive index of the upper first cladding layer 4a is higher than the refractive index of the upper second cladding layer 4b. Here, an Al composition ratio in n-AlGaAs of the upper first cladding layer 4a is adjusted to be lower than the Al composition ratio in the n-AlGaAs of the upper second cladding layer 4b. In this embodiment, the Al composition ratio of the upper first cladding layer 4a is the same as the Al composition ratio of the lower first cladding layer 3a (for example, 0.23 ($Al_{0.23}Ga_{0.77}As$)). The Al composition ratio of the lower second cladding layer 4b is the same as the Al composition ratio of the lower second cladding layer 3b (for example, 0.3 ($Al_{0.3}Ga_{0.7}As$)).

Here, the lower cladding layer 3 and the upper cladding layer 4 are structured to have symmetric compositions and thicknesses, thereby ensuring symmetry of widening of the optical mode diameter of emitted light. However, in order to simply widen the optical mode diameter, it is not limited to this symmetrical structure, and the composition and the thickness may be changed between the lower cladding layer 3 and the upper cladding layer 4.

The contact layer 5 is disposed on the upper second cladding layer 4b, and is formed of an n-GaAs layer with a thickness of about 0.3 μm.

As the lower surface electrode 6, there is formed an electrode with a thickness of about 3 μm formed of, for example, an AuGe/Au vapor deposition film and an Au plating on a lower surface of the GaAs substrate 1.

As the upper surface electrode 7, in a portion on the contact layer 5 and located above the active layer 2a, for example, an electrode with a thickness of about 3 μm formed of a Ti/Pt/Au vapor deposition film and an Au plating is formed.

In the quantum dot laser according to this embodiment, a left side part in FIG. 2 having the quantum dot active layer 2a, the lower surface electrode 6, and the upper surface electrode 7 is a quantum dot active layer part 10a, and a light emission side in a right side part in FIG. 2 having the GaAs waveguide core layer 2b is a waveguide part 10b with a tapered film thickness.

As in FIG. 3 and FIG. 4, the quantum dot active layer part 10a and the waveguide part 10b with a tapered film thickness both have a ridge-type waveguide structure, and a portion down to the upper first cladding layer 4a except a ridge mesa portion is removed. Therefore, the boundary region between the upper first cladding layer 4a and the upper second cladding layer 4b is located inside the ridge mesa portion.

By this structure, it is possible to widen the optical mode distribution to the inside of the ridge mesa portion. While the optical mode diameter is enlarged, leakage of light to the contact layer 5 is prevented, and a waveguide loss is suppressed. Consequently, a quantum dot laser having high coupling efficiency to an optical fiber or the like and having high output is achieved.

Note that the structures of FIG. 3 and FIG. 4 are examples. Operation and effect similar to those of this embodiment can be exhibited also by, for example, a structure in which the entire upper first cladding layer 4a is removed in the ridge mesa portion, or a structure in which part or the whole of the quantum dot active layer 2a is removed. However, as compared to the structure in which the upper first cladding layer 4a is removed down to the quantum dot active layer 2a in the ridge mesa portion, in the structure in which it is removed only down to the upper first cladding layer 4a, there is less damage to the quantum dot active layer 2a since side surfaces of the quantum dot active layer 2a are not exposed to the outside, and it is conceivable that high reliability can be obtained.

A difference in optical mode diameter in a vertical direction of emitted light between the structure of the quantum dot laser according to this embodiment and the structure of a quantum dot laser according to comparative example 1 will be explained.

The quantum dot laser of the comparative example 1 does not have the GaAs waveguide core layer 2b with a gradually decreasing film thickness and is constituted only of the quantum dot active layer 2a, and the lower cladding layer and the upper cladding layer do not have the lower second cladding layer 3b and the upper second cladding layer 4b, and are constituted only of the lower first cladding layer 3a and the upper first cladding layer 4a, respectively.

Figure 5A:
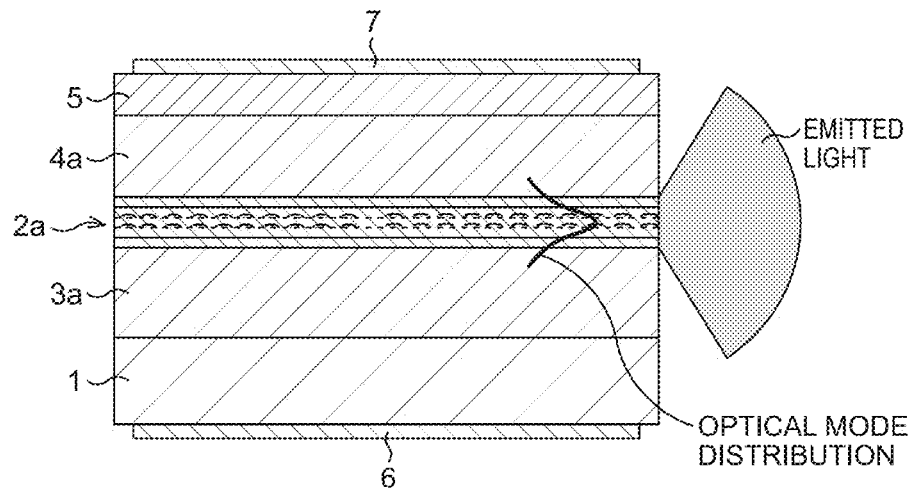
FIG. 5A is a schematic cross-sectional view illustrating an optical mode shape of a quantum dot laser according to comparative example 1.
Figure 5B:
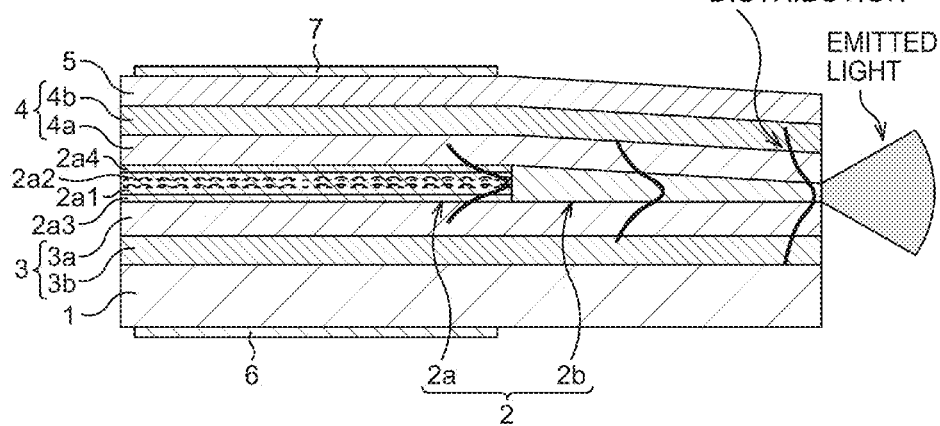
FIG. 5B is a schematic cross-sectional view illustrating an optical mode shape of the quantum dot laser according to the first embodiment.

FIG. 5A illustrates an optical mode shape by the structure of the comparative example 1, and FIG. 5B illustrates an optical mode shape by the structure of this embodiment and is a schematic cross-sectional view corresponding to FIG. 2.

In FIG. 5A of the comparative example 1, the optical mode diameter in the vertical direction of the emitted light is narrow, the radiation angle of output light enlarges, and the optical coupling efficiency to an optical fiber or the like decreases.

In FIG. 5B of this embodiment, the GaAs waveguide core layer 2b is formed in a tapered shape which gradually decreases in thickness in the direction to depart from the front end of the quantum dot active layer 2a. This structure weakens the confinement of the light propagated through the GaAs waveguide core layer 2b in the vicinity of the core layer 2b, and thus the optical mode diameter of emitted light in the vertical direction is enlarged. This makes the radiation angle of the output light narrow, and the optical coupling efficiency to an optical fiber or the like improves.

In the quantum dot active layer 2a, the volume occupied by the InAs quantum dots is quite small and it is substantially occupied by the GaAs barrier 2a1. The GaAs waveguide core layer 2b is constituted of GaAs. Thus, in the quantum dot active layer 2a and the GaAs waveguide core layer 2b, two optical waveguides formed of the substantially same material are joined. A reflection or a scattering loss in a joint interface, which are problematic when waveguides of different types are coupled, are suppressed, and the laser output is increased. Consequently, the intensity of light coupled to an optical fiber or the like improves.

Figure 6:
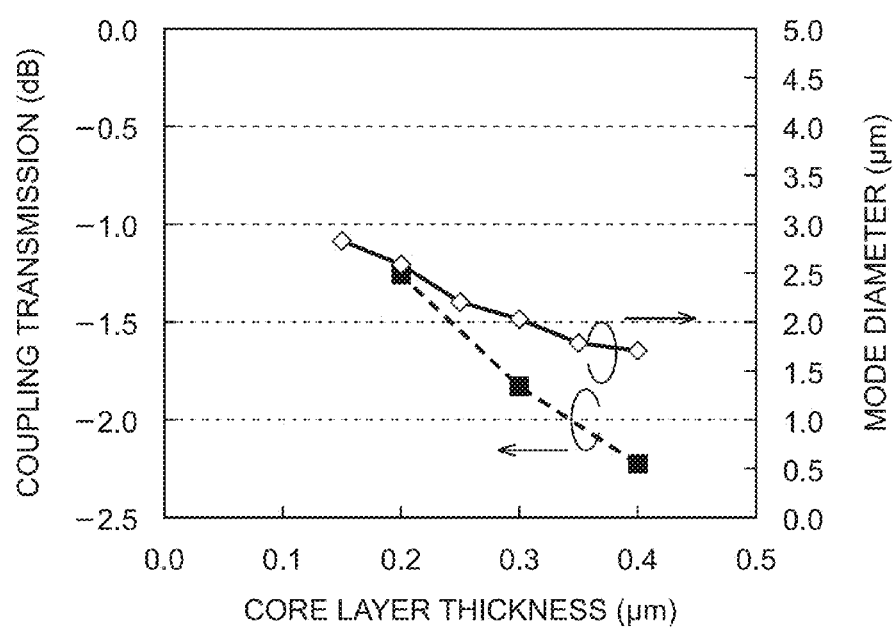
FIG. 6 is a characteristic chart illustrating calculation results of checking the relation of the thickness of a core layer at a light emission end surface with an optical mode diameter in a vertical direction and a coupling loss to another optical device by a simulation.

Here, calculation results of checking the relation of the thickness of the core layer of the GaAs waveguide core layer with the optical mode diameter in the vertical direction and the coupling loss to another optical device by a simulation will be explained. FIG. 6 is a characteristic chart illustrating this relation. Here, the optical mode diameter of the other optical device is assumed to be 3 μm. This corresponds to that the coupling loss of, for example, a Si waveguide with a spot size converter, or the like is considered.

As illustrated in FIG. 6, as the film thickness of the core layer is thinned, the optical mode diameter in the vertical direction enlarged from slightly less than 2 μm to about 3 μm, and it was recognized that the coupling loss is suppressed from slightly more than −2 dB to about slightly more than −1 dB, that is about the half.

Figure 7:
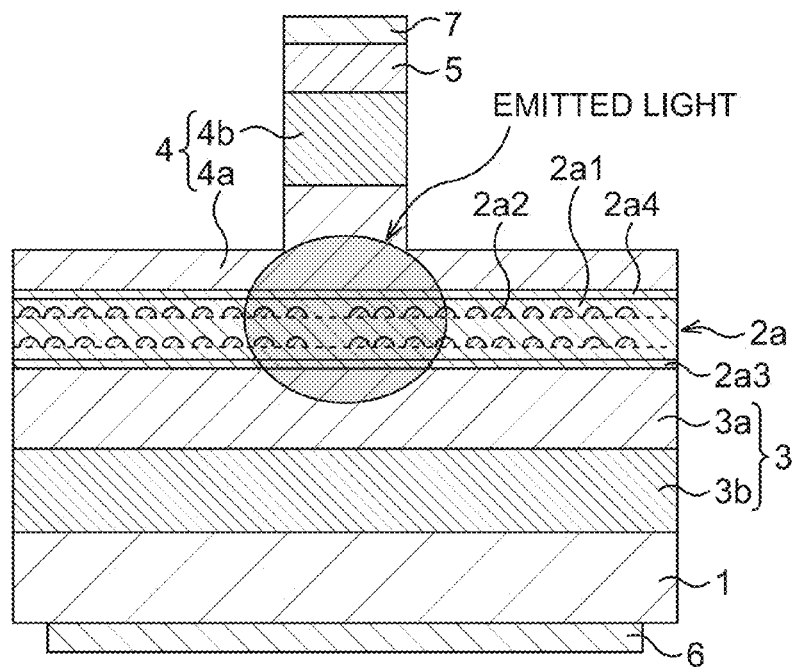
FIG. 7 is a schematic cross-sectional view illustrating an optical mode shape in a quantum dot active layer portion in the first embodiment.
Figure 8:
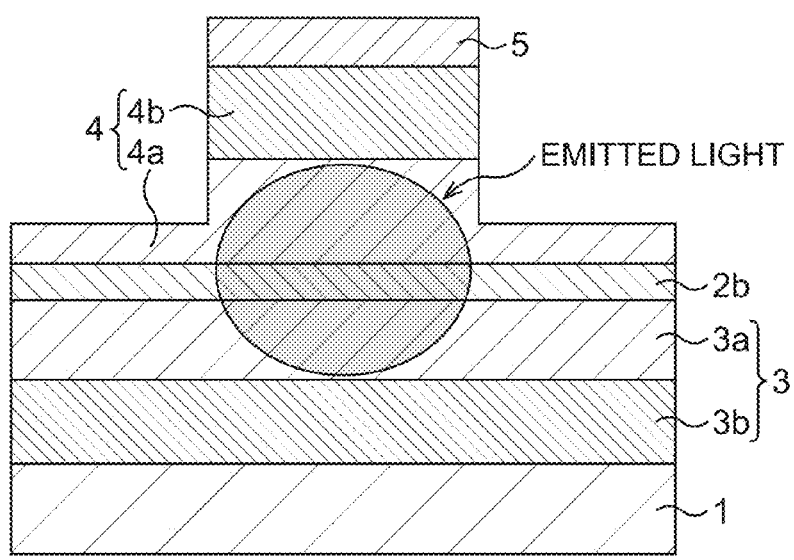
FIG. 8 is a schematic cross-sectional view illustrating an optical mode shape in a light emission end surface of a waveguide portion with a tapered film thickness in the first embodiment.

FIG. 7 illustrates an optical mode shape in the active layer in this embodiment, and is a schematic cross-sectional view corresponding to FIG. 3. FIG. 8 illustrates an optical mode shape in the front end of the GaAs waveguide core layer part in this embodiment, and is a schematic cross-sectional view corresponding to FIG. 4.

In the quantum dot laser according to this embodiment, the lower first cladding layer 3a is higher in refractive index than the lower second cladding layer 3b in the lower cladding layer 3, and the upper first cladding layer 4a is higher in refractive index than the upper second cladding layer 4b in the upper cladding layer 4. This structure securely confines light in the lower first cladding layer 3a and the upper first cladding layer 4a, and widening of the optical distribution (widening of the optical mode diameter) that is more than necessary to the outside of the lower second cladding layer 3b and the upper second cladding layer 4b is prevented. Thus, leakage of the light distribution to the GaAs substrate 1 and the contact layer 5 is prevented, a light propagation loss is reduced, and laser output is increased.

Further, the ridge structure of core layer 2b is formed in a shape which gradually increases in width in the direction to depart from the front end of the quantum dot active layer 2a. By this structure, as illustrated in FIG. 7 and FIG. 8, the optical mode diameter in a leftward and rightward direction in the light emission end is sufficiently enlarged, and it becomes possible to further improve the coupling efficiency to an optical fiber or the like.

Here, calculation results of comparing the optical mode distribution between the structure of the quantum dot laser according to this embodiment and the structure of a quantum dot laser according to the comparative example 2 will be explained.

The quantum dot laser of the comparative example 2 has the tapered waveguide part constituted of the GaAs waveguide core layer 2b with a gradually decreasing film thickness, but the lower cladding layer and the upper cladding layer do not have the lower second cladding layer 3b and the upper second cladding layer 4b, and are constituted only of the lower first cladding layer 3a and the upper first cladding layer 4a.

Figure 9A:
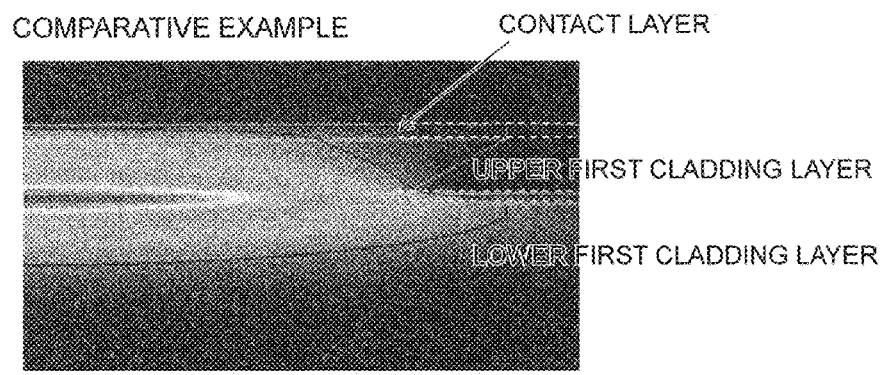
FIG. 9A is a simulation diagram illustrating an optical mode distribution of a quantum dot laser by comparative example 2.
Figure 9B:
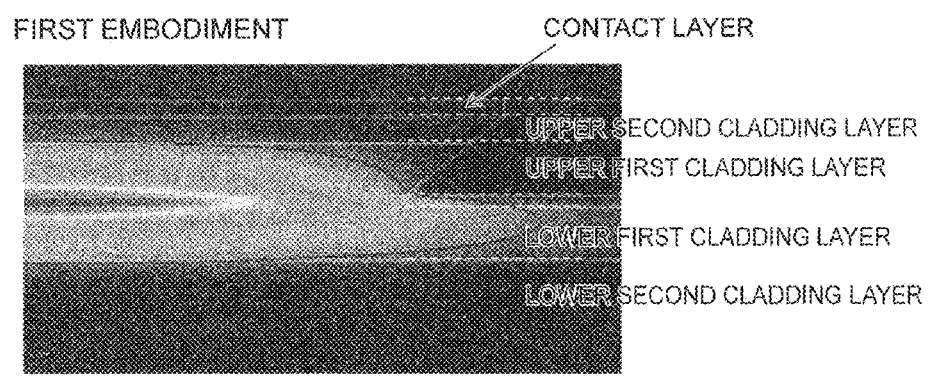
FIG. 9B is a simulation diagram illustrating an optical mode distribution of the quantum dot laser by the first embodiment.

FIG. 9A is a simulation result illustrating the optical mode distribution by the structure of the comparative example 2, and FIG. 9B is a simulation result illustrating the optical mode distribution by the structure of this embodiment.

In FIG. 9A of the comparative example 2, the optical distribution leaks out to the contact layer. On the other hand, in FIG. 9B of this embodiment, it was recognized that widening of the optical mode diameter is suppressed in the boundary region between the upper first cladding layer 4a and the upper second cladding layer 4b, and the optical distribution is not leaked out to the contact layer.

The lower first cladding layer 3a and the upper first cladding layer 4a have an Al composition ratio of a small value of about 0.1 to about 0.25 that is close to GaAs, and the refractive index difference with the core layer 2b constituted of GaAs is suppressed small. Thus, the optical mode diameter on the thin light emission end of the core layer 2b widens sufficiently.

The lower second cladding layer 3b and the upper second cladding layer 4b have an Al composition ratio adjusted to be higher than the Al composition ratio of the lower first cladding layer 3a and the upper first cladding layer 4a by 0.05 or more, resulting in a significant effect of confining light.

In the quantum dot laser according to this embodiment, in principle, the optical mode diameter in the vertical direction widens up to the width from the lower surface of the lower first cladding layer 3a to the upper surface of the upper first cladding layer 4a. Accordingly, the optical mode diameter can be adjusted by controlling the thicknesses of the lower first cladding layer 3a and the upper first cladding layer 4a. By ensuring the thicknesses of the lower first cladding layer 3a and the upper first cladding layer 4a of 1 μm or more, the optical mode diameter in the vertical direction is expanded by 2 μm or more, and coupling of the quantum dot laser to another optical device such as an optical fiber is improved.

In this embodiment, each of the lower cladding layer 3 and the upper cladding layer 4 is formed by using AlGaAs as a material, but it is not limited to this. For example, in the lower cladding layer 3 and the upper cladding layer 4, the lower second cladding layer 3a and the upper second cladding layer 4a may be formed from InGaP as a material. In this case, the Al composition ratio in AlGaAs of the lower first cladding layer 3b and the upper first cladding layer 4b is adjusted to control the refractive indexes of the lower second cladding layer 3a and the upper second cladding layer 4a to be lower than the refractive indexes of the lower first cladding layer 3b and the upper first cladding layer 4b.

Further, the quantum dot 2a2 in the quantum dot active layer 2a is formed from InAs as a material, but it is not limited to this. For example, the quantum dot in the quantum dot active layer 2a may be formed from InGaAs as a material, and a desired optical wavelength may be obtained by adjusting the composition ratio of Ga.

Method of Manufacturing the Quantum Dot Laser

Hereinafter, a method of manufacturing the quantum dot laser having the above-described structure will be explained.

FIG. 10A to FIG. 11C are schematic views illustrating the method of manufacturing the quantum dot laser according to the first embodiment in the order of steps. In FIG. 10A to FIG. 11C, a view on the right is a schematic plan view, and a view on the left is a schematic cross-sectional view taken along the dashed line I-I' of the view on the right.

Figure 10A:
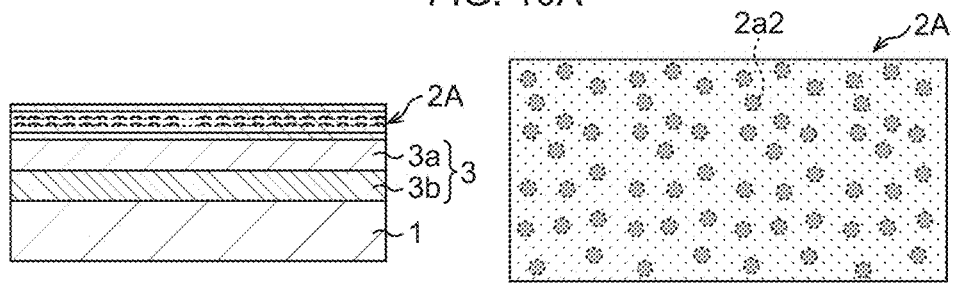
FIG. 10A is a schematic view illustrating a method of manufacturing the quantum dot laser according to the first embodiment.

First, as illustrated in FIG. 10A, on the GaAs substrate 1, the lower cladding layer 3 (the lower second cladding layer 3b and the lower first cladding layer 3a) and a material layer to be the quantum dot active layer 2a (hereinafter referred to as a quantum dot active layer material layer 2A) are formed sequentially.

Specifically, p-$Al_{0.3}Ga_{0.7}As$, p-$Al_{0.23}Ga_{0.77}As$, and the quantum dot active layer material layer 2A, which is a layered structure of quantum dots including a GaAs layer to be a guide layer, are sequentially grown on the GaAs substrate 1 of p-GaAs by, for example, a molecular beam epitaxy (MBE) method. The lower cladding layer 3 and the quantum dot active layer material layer 2A are thus formed on the GaAs substrate 1.

Here, instead of the MBE method, a metalorganic chemical vapor deposition (MOCVD) method can also be used. However, the MBE method is more suitable for growth of quantum dots in view of easiness of film thickness control in an atomic layer level, and so forth.

Figure 10B:
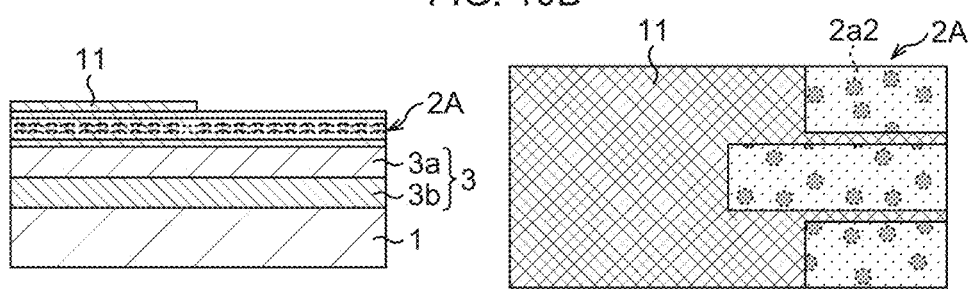
FIG. 10B is a schematic view illustrating the method of manufacturing the quantum dot laser according to the first embodiment, following FIG. 10A.

Subsequently, as illustrated in FIG. 10B, a first insulator mask 11 is formed on the active layer material layer 2A.

In detail, an insulating film, for example $SiO_2$ film is formed by the CVD method or the like on the quantum dot active layer material layer 2A. A resist is applied on the $SiO_2$ film, and the resist is processed by lithography, so as to form a resist mask. This resist mask is used to dry etch the $SiO_2$ film. The resist mask is removed appropriately. Thus, the $SiO_2$ film is removed leaving the portion covered with the resist mask, and the first insulator mask 11 constituted of the remaining $SiO_2$ film is formed. The first insulator mask 11 has a shape such that its coverage becomes denser in a direction to be closer to the portion to be the quantum dot active layer 2a, and becomes sparse in a direction to depart therefrom.

Figure 10C:
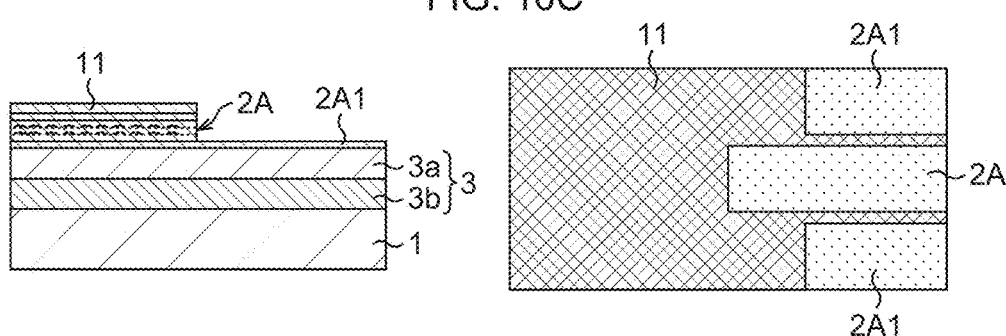
FIG. 10C is a schematic view illustrating the method of manufacturing the quantum dot laser according to the first embodiment, following FIG. 10B.

Subsequently, as illustrated in FIG. 10C, the quantum dot active layer material layer 2A is etched while leaving a material layer to be the guide layer 2a3 (hereinafter referred to as a guide layer material layer 2A1).

In detail, by using the first insulator mask 11, the quantum dot active layer material layer 2A exposed from the first insulator mask 11 is dry etched. At this time, at least a portion of the guide layer material layer 2A1 as the lowest layer of the active layer material layer 2A is left. Specifically, after being etched, the quantum dot active layer material layer 2A is removed while leaving the portion covered with the first insulator mask 11, and the guide layer material layer 2A1 covering the surface of the lower first cladding layer 3a is exposed from the first insulator mask 11. Note that the dry etching may be performed so that instead of leaving at least a portion of the guide layer material layer 2A1 as the lowest layer of the active layer material layer 2A, at least a portion on or above the guide layer material layer 2A1 of the active layer material layer 2A is left.

By partially leaving the guide layer material layer 2A1, the lower first cladding layer 3a (AlGaAs) which can be easily oxidized after being etched is covered with the guide layer material layer 2A1. Oxidization of the lower first cladding layer 3a during production of elements is prevented, and improvement in reliability of elements is expected.

Figure 10D:
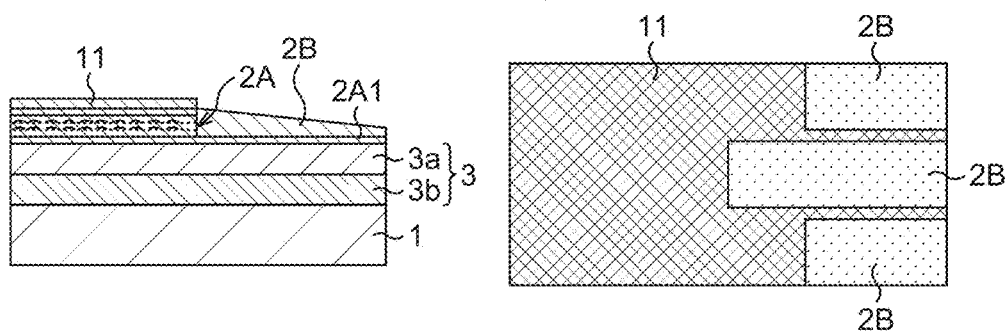
FIG. 10D is a schematic view illustrating the method of manufacturing the quantum dot laser according to the first embodiment, following FIG. 10C.

Subsequently, as illustrated in FIG. 10D, a material layer to be the GaAs core layer 2b (hereinafter referred to as a GaAs core layer material layer 2B) is formed.

In detail, in a state that the first insulator mask 11 is left, GaAs is grown by, for example, the MOCVD method on the guide layer material layer 2A1 exposed from the first insulator mask 11. This GaAs does not grow on the first insulator mask 11, moves by migration, and grows on the portion where the first insulator mask 11 is absent and the guide layer material layer 2A1 is exposed. As a result, in the portion close to the quantum dot active layer part where the coverage of the first insulator mask 11 is dense, more GaAs accumulates and hence GaAs grows thick, and in the portion distant from the quantum dot active layer part where the coverage of the first insulator mask 11 is sparse, GaAs grows thin. Thus, the GaAs core layer material layer 2B in a tapered shape which gradually decreases in thickness in the direction to depart from the quantum dot active layer material layer 2A is formed and joined to the quantum dot active layer material layer 2A. The first insulator mask 11 is adjusted in denseness so as to utilize the above-described selective growth effect. Use of this first insulator mask 11 allows the GaAs core layer material layer 2B in a desired tapered shape to be formed in a self-aligning manner.

In this embodiment, in a state that side surfaces of the quantum dot active layer material layer 2A which is substantially occupied by GaAs and the surface of the guide layer material layer 2A1 constituted of GaAs are both exposed, the core layer material layer 2B constituted of GaAs is similarly formed. Thus, occurrence of defects and the like in a growth interface which occurs when different materials are joined can be prevented.

Incidentally, when the selective growth effect using the insulator mask as above is used with a mixed crystal material such as InGaAsP, if the thickness of InGaAsP or the like changes, the composition of the material (for example, the ratio of In and Ga, the ratio of As and P) also changes, and it is difficult to form a core layer material layer with a composition and a thickness which are desired. On the other hand, in this embodiment, it is GaAs, which is binary material, that changes the film thickness, and the composition thereof includes Ga and As of 1:1 irrespective of the film thickness, and thus the GaAs core layer material layer 2B can be formed with good controllability.

Figure 11A:
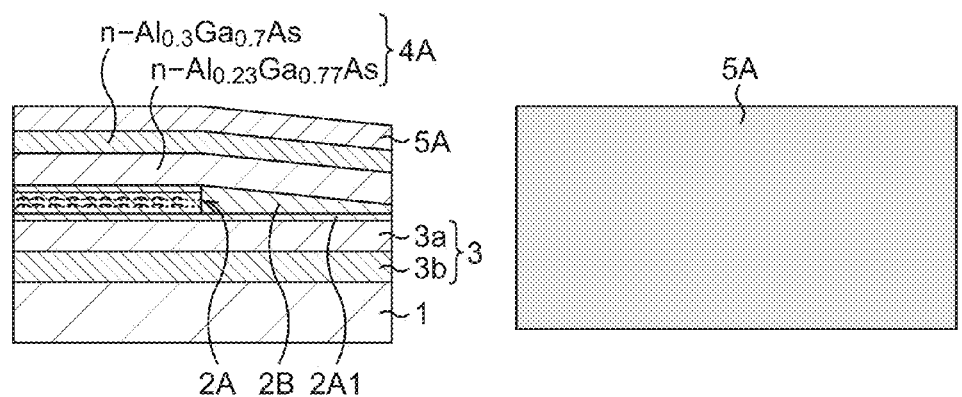
FIG. 11A is a schematic view illustrating the method of manufacturing the quantum dot laser according to the first embodiment, following FIG. 10D.

Subsequently, as illustrated in FIG. 11A, after the first insulator mask 11 is removed, a material layer (hereinafter referred to as an upper cladding layer material layer 4A) to be the upper cladding layer 4 (the upper first cladding layer 4a and the upper second cladding layer 4b) and a material layer (hereinafter referred to as a contact layer material layer 5A) to be the contact layer 5 are formed sequentially.

In detail, first, the first insulator mask 11 remaining on the active layer material layer 2A is removed by a predetermined wet treatment or the like.

Next, for example by the MBE method, n-$Al_{0.23}Ga_{0.77}As$, n-$Al_{0.3}Ga_{0.7}As$, and n-GaAs are sequentially grown. The upper cladding layer material layer 4A and the contact layer material layer 5A are thus formed.

Figure 11B:
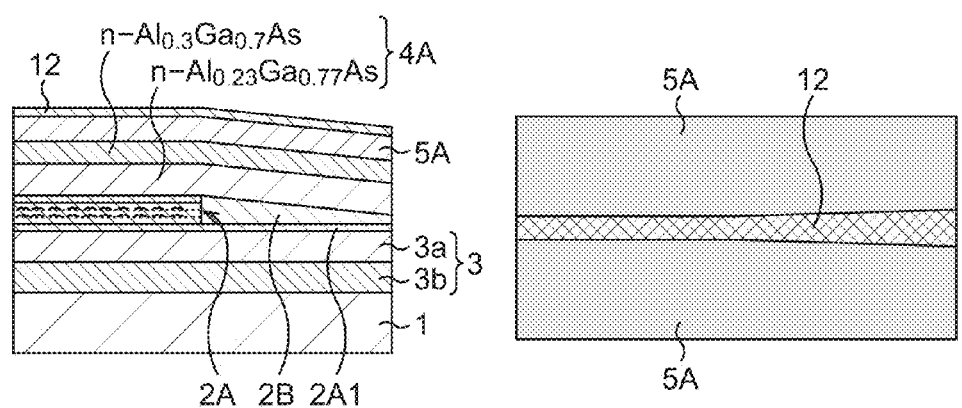
FIG. 11B is a schematic view illustrating the method of manufacturing the quantum dot laser according to the first embodiment, following FIG. 11A.

Subsequently, as illustrated in FIG. 11B, a second insulator mask 12 is formed on the contact layer material layer 5A.

In detail, an insulating film, for example $SiO_2$ film is formed by the CVD method or the like on the contact layer material layer 5A. A resist is applied on the $SiO_2$ film, and the resist is processed by lithography, so as to form a resist mask. This resist mask is used to dry etch the $SiO_2$ film. The resist mask is removed appropriately. Thus, the $SiO_2$ film is removed leaving the portion covered with the resist mask, and the second insulator mask 12 constituted of the remaining $SiO_2$ film is formed. In the second insulator mask 12, the quantum dot active layer part is formed in a band shape of the same width, and the GaAs core layer part is formed in a band shape having a width which gradually increases in the direction to depart from the active layer part, so as to form the shape of the optical waveguide layer 2.

Figure 11C:
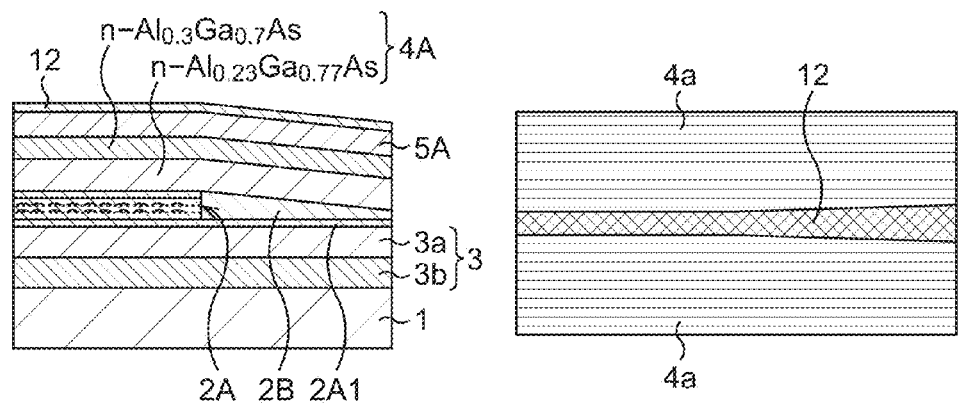
FIG. 11C is a schematic view illustrating the method of manufacturing the quantum dot laser according to the first embodiment, following FIG. 11B.

Subsequently, the contact layer material layer 5A and the upper cladding layer material layer 4A are etched as illustrated in FIG. 11C.

In detail, by using the second insulator mask 12, the contact layer material layer 5A and the upper cladding layer material layer 4A are removed down to a middle of n-$Al_{0.23}Ga_{0.77}As$ of the upper cladding layer material layer 4A by dry etching.

Thereafter, the second insulator mask 12 is removed by a predetermined wet treatment or the like, and then the lower surface electrode 6 is formed on the lower surface of the GaAs substrate 1 and the upper surface electrode 7 is formed on the contact layer 5. Thus, the quantum dot laser illustrated in FIG. 1 to FIG. 4 is formed.

As has been described, according to this embodiment, a quantum dot laser is achieved in which an optical mode diameter on the emission end is widened and the radiation angle of output light is narrowed with a relatively simple structure, but expansion of the optical mode diameter that is more than necessary is inhibited to prevent leakage of light so as to securely confine the light in the waveguide, thereby improving optical coupling efficiency while suppressing a light propagation loss, and obtaining sufficient optical output.

Second Embodiment

Next, a second embodiment will be explained. In this embodiment, a quantum dot laser is disclosed similarly to the first embodiment, but it is different from the first embodiment in that an etching stop layer and an electron barrier layer are added.

Structure of the Quantum Dot Laser

Figure 12:
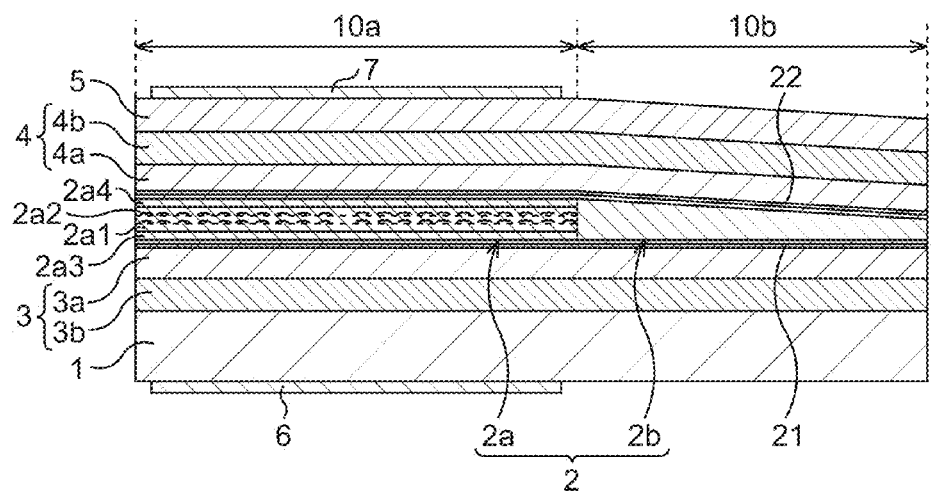
FIG. 12 is a schematic cross-sectional view illustrating the structure of a quantum dot laser according to a second embodiment.
Figure 13:
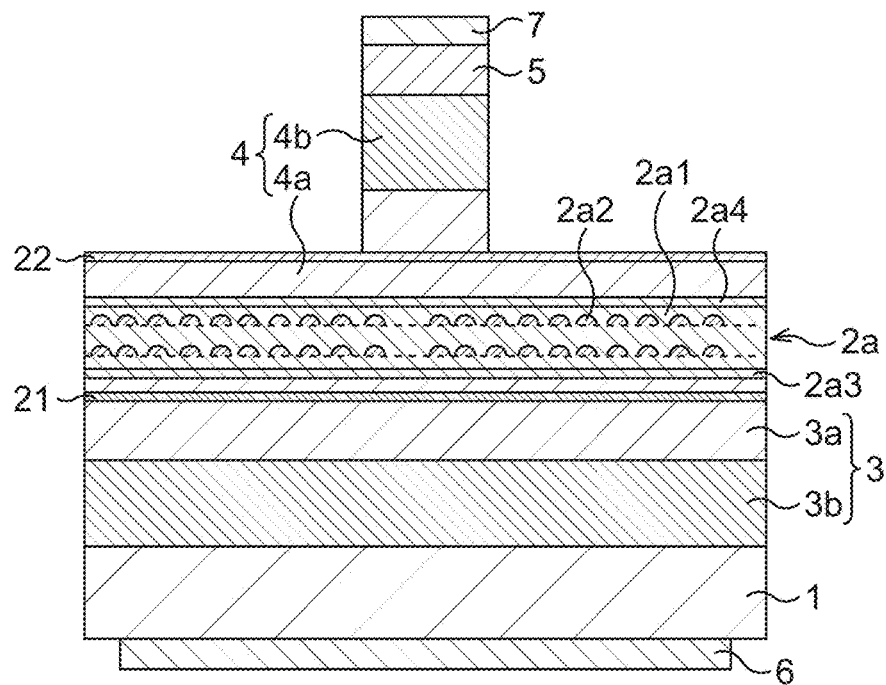
FIG. 13 is a schematic cross-sectional view illustrating the structure of the quantum dot laser according to the second embodiment.
Figure 14:
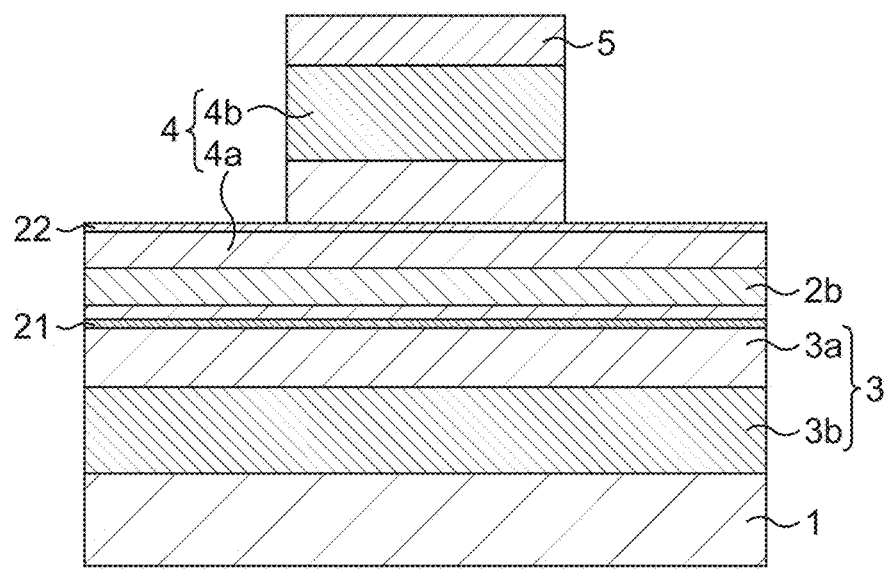
FIG. 14 is a schematic cross-sectional view illustrating the structure of the quantum dot laser according to the second embodiment.

FIG. 12 is a schematic cross-sectional view illustrating the structure of the quantum dot laser according to the second embodiment, and corresponds to FIG. 2 of the first embodiment. FIG. 13 is a schematic cross-sectional view illustrating the structure of the quantum dot laser according to the second embodiment, and corresponds to FIG. 3 of the first embodiment. FIG. 14 is a schematic cross-sectional view illustrating the structure of the quantum dot laser according to the second embodiment, and corresponds to FIG. 4 of the first embodiment.

Note that the same constituent members and the like as those of the quantum dot laser of the first embodiment are given the same reference numerals, and detailed explanations are omitted.

The quantum dot laser according to this embodiment is a quantum dot laser with a spot-size converter. This quantum dot laser has, similarly to the first embodiment, a structure including a p-type GaAs substrate 1 as a semiconductor substrate, a quantum dot active layer 2a having a barrier layer of GaAs, a GaAs waveguide core layer 2b which is joined to the quantum dot active layer 2a and has a thickness which gradually decreases in a direction to depart from the quantum dot active layer, a lower cladding layer 3 and an upper cladding layer 4 which sandwich the quantum dot active layer 2a and the GaAs waveguide core layer 2b, a contact layer 5, a lower surface electrode 6, and an upper surface electrode 7.

In this quantum dot laser, in addition to the structure of the first embodiment, an electron barrier layer 21 is formed in a lower first cladding layer 3a of the lower cladding layer 3, and an etching stop layer 22 is formed in an upper first cladding layer 4a of the upper cladding layer 4.

The electron barrier layer 21 is disposed in the lower first cladding layer 3a of the lower cladding layer 3, and is formed of a thin p-AlGaAs layer with a thickness of about 100 nm or less, here about several tens of nm. The Al composition ratio of the electron barrier layer 21 is higher than the Al composition ratio of the lower first cladding layer 3a.

The electron barrier layer 21 is for forming a high barrier on a conduction band side, so as to prevent leakage of electrons to the side of the lower cladding layer 3. Disposing the electron barrier layer 21 can improve the efficiency of injecting electrons into the quantum dot active layer 2a, reduce a threshold value, and also improve optical output-current efficiency. The electron barrier layer 21 is a thin film, and thus its influence to the optical distribution is suppressed small.

In order to form the electron barrier layer 21, the aforementioned p-AlGaAs may be grown in middle of forming the lower first cladding layer 3a by the MBE method or the like in the step of FIG. 10A in the first embodiment.

The etching stop layer 22 is disposed in a boundary region with a ridge mesa portion in the upper first cladding layer 4a of the upper cladding layer 4. The etching stop layer 22 is formed of a material which ensures a sufficient etching selection ratio with the n-AlGaAs of the upper first cladding layer 4a, which is, for example, an n-InGaP layer. The etching stop layer 22 is formed with a thickness of about 100 nm or less, here, about several tens of nm. The etching stop layer 22 is a thin film, and thus its influence to the optical distribution is suppressed small.

In order to form the etching stop layer 22, in the step of FIG. 11A in the first embodiment, the aforementioned n-InGaP may be formed in middle of forming n-Al$_{0.23}$Ga$_{0.77}$As as the upper first cladding layer 4a by the MBE method or the like in the step of FIG. 11A in the first embodiment.

The etching stop layer 22 functions as an etching stopper during etching of the contact layer material layer 5A and the upper cladding layer material layer 4A using the second insulator mask 12 in the step of FIG. 11C in the first embodiment, and can accurately stop the etching of the upper cladding layer material layer 4A at a desired position. Thus, a desired ridge structure can be formed easily.

According to this embodiment, a quantum dot laser is achieved in which an optical mode diameter in the vertical direction on the light emission end is widened and the radiation angle of output light is narrowed with a relatively simple structure, but expansion of the optical mode diameter that is more than necessary is inhibited to securely prevent leakage of light, thereby having a small coupling loss and obtaining sufficient optical output.

Third Embodiment

Next, a third embodiment will be explained. In this embodiment, an optical semiconductor device is disclosed in which the quantum dot laser according to the first or second embodiment is hybrid-integrated with another optical waveguide device. In this embodiment, as the other optical waveguide device, a wavelength selective laser of hybrid-integrated type using a wavelength selecting filter constituted of a Si waveguide will be illustrated.

Figure 15:
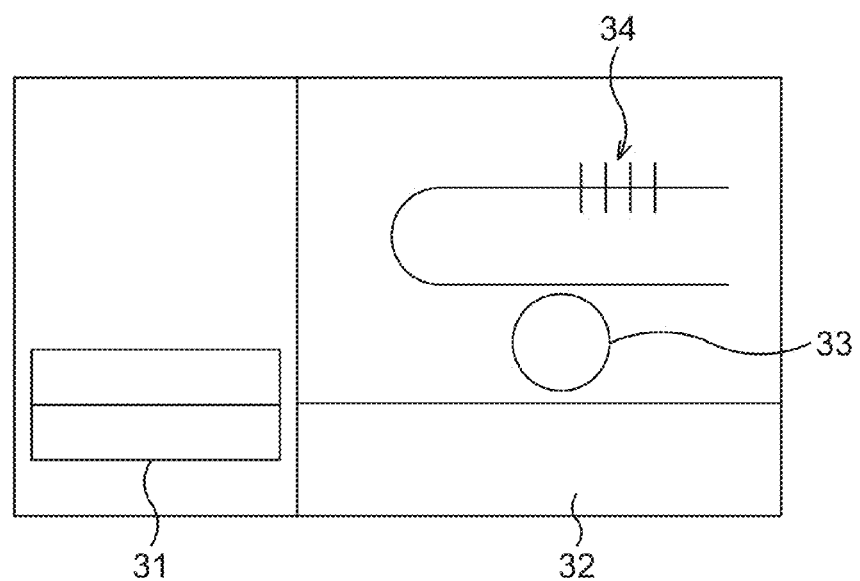
FIG. 15 is a schematic diagram illustrating a wavelength selective laser according to a third embodiment.

FIG. 15 is a schematic diagram illustrating the wavelength selective laser according to the third embodiment.

The wavelength selective laser according to this embodiment has a quantum dot laser 31 according to the first or the second embodiment and a wavelength selecting filter 32 of a Si waveguide. This wavelength selective laser has a structure in which the side of a waveguide portion 10b with a tapered thickness of the quantum dot laser 31 and the wavelength selecting filter 32 are butt-coupled.

The quantum dot laser 31 is combined with the wavelength selecting filter 32 to perform a laser oscillation. For this purpose, in the quantum dot laser 31, an anti-reflective coating is provided on an end surface on the wavelength selecting filter 32 side, and a high-reflective coating is provided on an end surface on the opposite side, so that the quantum dot laser 31 alone is inhibited from performing the laser oscillation and is allowed to function as a gain medium.

The wavelength selecting filter 32 is an optical waveguide including a ring oscillator 33 and a DBR mirror 33, and is able to cause, when combined with the quantum dot laser 31, a laser oscillation at a desired wavelength. In order to improve a coupling efficiency of the quantum dot laser 31 and the wavelength selecting filter 32, a structure with a spot-size converter formed on an end surface side of the wavelength selecting filter 32 is desired.

The wavelength selection laser according to this embodiment, by use of the quantum dot laser 31 as a gain medium, enables to achieve a structure with a small deterioration in properties at high temperatures. Further, since the spot-size converter constituted of the waveguide portion 10b with a tapered thickness is integrated in the quantum dot laser 31, the efficiency of coupling to the wavelength selecting filter 32 can be improved, and laser output can be increased.

In this embodiment, the optical waveguide having the wavelength selecting filter function is illustrated as the Si optical waveguide, but it is not restrictive. For example, when a modulator constituted of a Si optical waveguide and/or an optical waveguide or the like having a wavelength variable filter function is hybrid-integrated with the quantum dot laser 31, similarly, a hybrid-integrated type optical semiconductor element can be obtained which has a small deterioration in properties at high temperatures and is able to obtain high optical output. Further, in this embodiment, the quantum dot laser 31 alone is inhibited from performing the laser oscillation, but in the case where, for example, it is combined with the modulator constituted of a Si optical waveguide, or the like, it is also possible to combine the quantum dot laser which oscillates alone and the modulator. In this case, for example, a coating may be provided to both end surfaces of the quantum dot laser to give them a certain degree of reflectivity, or a Fabry-Perot quantum dot laser which utilizes a reflection by a cleavage end surface may be used, or a quantum dot DFB laser in which a diffraction lattice is formed in the vicinity of an optical waveguide may be used.

According to the embodiments, in an optical semiconductor element having quantum dots, an optical mode diameter on a light emission end is widened and the radiation angle of output light is narrowed, but expansion of the optical mode diameter that is more than necessary is inhibited to prevent leakage of light so as to securely confine the light in the waveguide, thereby improving optical coupling efficiency while suppressing a propagation loss of light, and obtaining sufficient optical output.

Further, abnormality occurring in a joining interface is prevented when a quantum dot active laser and a spot size converter constituted of a core layer with a film thickness which gradually becomes thin are joined, which enables stable manufacturing of elements.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An optical semiconductor element comprising:
a GaAs semiconductor substrate;
a quantum dot active layer configured to have a barrier layer of GaAs and quantum dots;
a GaAs waveguide core layer configured to be joined to the quantum dot active layer and have a thickness which gradually decreases in a direction to depart from the quantum dot active layer; and
a lower cladding layer and an upper cladding layer configured to sandwich the quantum dot active layer and the GaAs waveguide core layer,
wherein each of the lower cladding layer and the upper cladding layer is a layered structure which has a first cladding layer and a second cladding layer which is disposed on a side farther from the quantum dot active layer and the GaAs waveguide core layer than the first cladding layer, and
a refractive index of the first cladding layer is higher than a refractive index of the second cladding layer.

2. The optical semiconductor element according to claim 1, wherein the first cladding layer and the second cladding layer are both an AlGaAs layer, and an Al composition ratio of the first cladding layer is lower than an Al composition ratio of the second cladding layer.

3. The optical semiconductor element according to claim 2, wherein the first cladding layer has a thickness equal to or more than 1 μm.

4. The optical semiconductor element according to claim 2, wherein the Al composition ratio of the first cladding layer is a value in a range of 0.1 to 0.25.

5. The optical semiconductor element according to claim 2, wherein the Al composition ratio of the first cladding layer is lower than the Al composition ratio of the second cladding layer by 0.05 or more.

6. The optical semiconductor element according to claim 2, wherein the Al composition ratios and thicknesses of the first cladding layer of the lower cladding layer and the first cladding layer of the upper cladding layer are the same, and the Al composition ratios of the second cladding layer of the lower cladding layer and the second cladding layer of the upper cladding layer are the same.

7. The optical semiconductor element according to claim 1, wherein the GaAs waveguide core layer is gradually increases in width in a direction to depart from the quantum dot active layer.

8. The optical semiconductor element according to claim 1, wherein an etching stop layer is formed in the upper cladding layer.

9. The optical semiconductor element according to claim 1, wherein an electron barrier layer is formed in the lower cladding layer.

10. An optical semiconductor device comprising an optical semiconductor element; and a waveguide-type optical device which is optically connected to the optical semiconductor element,
the optical semiconductor element having:
a GaAs semiconductor substrate;
a quantum dot active layer which has a barrier layer of GaAs and quantum dots;
a GaAs waveguide core layer which is joined to the quantum dot active layer and has a thickness which gradually decreases in a direction to depart from the quantum dot active layer; and
a lower cladding layer and an upper cladding layer which sandwich the quantum dot active layer and the GaAs waveguide core layer,
wherein each of the lower cladding layer and the upper cladding layer is a layered structure which has a first cladding layer and a second cladding layer which is disposed on a side farther from the quantum dot active layer and the GaAs waveguide core layer than the first cladding layer, and
a refractive index of the first cladding layer is higher than a refractive index of the second cladding layer.

11. The optical semiconductor device according to claim 10, wherein the first cladding layer and the second cladding layer are both an AlGaAs layer, and an Al composition ratio of the first cladding layer is lower than an Al composition ratio of the second cladding layer.

12. A method of manufacturing an optical semiconductor element, the method comprising:
sequentially forming on a GaAs substrate a lower cladding layer, a lower guide layer, a quantum dot active layer which has a barrier layer of GaAs and quantum dots, and an upper guide layer;
forming a mask which covers a portion where a waveguide constituted of the quantum dot active layer is formed;
etching a portion other than the portion covered with the mask so that a portion of the lower guide layer or a portion of the quantum dot active layer remains; and
selectively forming a GaAs waveguide core layer on a portion removed by the etching, and joining the quantum dot active layer and the GaAs waveguide core layer.

13. The method of manufacturing the optical semiconductor element according to claim 12, wherein a coverage of the mask becomes higher in a vicinity of a portion to be the waveguide constituted of the quantum dot active layer, and the coverage becomes lower in a direction to depart from the portion to be the waveguide constituted of the quantum dot active layer.

* * * * *